(12) United States Patent
Weiss et al.

(10) Patent No.: US 12,719,452 B1
(45) Date of Patent: Aug. 25, 2026

(54) RECEIVER WITH TRANSCODER AND ADAPTIVE FILTER

(71) Applicant: Marvell Asia Pte, Ltd., Santa Clara, CA (US)

(72) Inventors: Oliver Weiss, Kaarst (DE); Martin Broich, Aachen (DE)

(73) Assignee: Marvell Asia Pte, Ltd., Santa Clara, CA (US)

( * ) Notice: Subject to any disclaimer, the term of this patent is extended or adjusted under 35 U.S.C. 154(b) by 1176 days.

(21) Appl. No.: 17/494,380

(22) Filed: Oct. 5, 2021

Related U.S. Application Data

(63) Continuation of application No. 16/419,625, filed on May 22, 2019, now Pat. No. 11,139,800.

(60) Provisional application No. 62/676,001, filed on May 24, 2018.

(51) Int. Cl.
*H03H 21/00* (2006.01)
*H03H 17/00* (2006.01)
*H03H 17/02* (2006.01)

(52) U.S. Cl.
CPC .... *H03H 21/0025* (2013.01); *H03H 17/0255* (2013.01); *H03H 2017/0081* (2013.01)

(58) Field of Classification Search
CPC ............... H03H 2218/02–025; H03H 2218/06
USPC .......................................................... 708/322
See application file for complete search history.

(56) References Cited

U.S. PATENT DOCUMENTS 5,534,933 A * 7/1996 Yang ...................... H04N 7/045 348/E7.024
5,987,487 A * 11/1999 Welland .................. H03M 7/18 708/319
6,163,788 A 12/2000 Chen et al.
7,167,514 B2 1/2007 McElroy et al.
7,945,610 B2 * 5/2011 Takahashi ............... G06F 17/15 708/319
9,088,472 B1 * 7/2015 Jain ........................ H04L 27/364
12,580,599 B2 * 3/2026 Keller .................. H04B 1/0483
2002/0013798 A1 * 1/2002 Willson, Jr. ........... H03H 17/06 708/319
2002/0152253 A1 * 10/2002 Ricks ................. H03H 21/0029 708/322

(Continued)

OTHER PUBLICATIONS

S. Bhoja, "PAM4 signaling for intra-data center and data center to data center connectivity (DCI)," 2017 Optical Fiber Communications Conference and Exhibition (OFC), Los Angeles, CA, USA, 2017, pp. 1-54. (Year: 2017).*

(Continued)

*Primary Examiner* — James Trujillo
*Assistant Examiner* — Markus Anthony Villanueva

(57) ABSTRACT

A receiver circuit is disclosed. The receiver circuit includes an input circuit configured to receive a data stream defined by a plurality of input symbols. Ones of the input symbols are encoded with M-bit values. A transcoder transcodes the input symbols in the data stream encoded with M-bit values to a stream of transcoded symbols. Ones of the transcoded symbols are encoded with N-bit values, where N<M. An adaptive filter is configured to remove noise from the stream of transcoded symbols to generate a stream of filtered transcoded symbols. A recoder is configured to recode the stream of filtered transcoded symbols to a stream of recoded symbols, where ones of the recoded symbols are encoded with M-bit values.

28 Claims, 3 Drawing Sheets

(56) References Cited

U.S. PATENT DOCUMENTS

| | | | | |
|---|---|---|---|---|
| 2003/0021340 | A1* | 1/2003 | McElroy | H03H 17/0225 375/353 |
| 2005/0070228 | A1 | 3/2005 | Hara et al. | |
| 2005/0094723 | A1 | 5/2005 | Takatori | |
| 2005/0286656 | A1* | 12/2005 | Muralidhar | H03M 13/37 375/242 |
| 2007/0121716 | A1* | 5/2007 | Nagarajan | H03M 1/0682 375/295 |
| 2018/0183629 | A1 | 6/2018 | Pandey | |
| 2026/0012380 | A1* | 1/2026 | Balan | H04L 25/03057 |

OTHER PUBLICATIONS

Frank Vahid. 2011. Digital Design with RTL Design, Verilog and VHDL (2nd. ed.). Wiley Publishing. (Year: 2011).*

Lyons, Richard G.. "Understanding Digital Signal Processing". United Kingdom, Pearson Education, Ch. 5, 2011. (Year: 2011).*

Jackson, Leland B.. "Digital Filters and Signal Processing with MATLAB Exercises". Third Edition. Springer Science+Business Media New York, Ch. 4, 2002. ISBN 978-1-4419-5153-3. (Year: 2002).*

McQuilken, Mark. LeBlanc, James P.. "Digital Signal Processing and the Microcontroller". Motorola, Inc., Ch. 6, 1989. (Year: 1989).*

Horowitz, Paul, et al., The Art of Electronics. 3rd ed., Cambridge University Press, 2015. (Year: 2015).*

Neil Weste and David Harris. 2010. CMOS VLSI Design: A Circuits and Systems Perspective (4th. ed.). Addison-Wesley Publishing Company, USA. (Year: 2010).*

Patterson, David A., and John L. Hennessy. Computer Organization and Design: The Hardware/Software Interface (5th Edition). Morgan Kaufmann, 2013. (Year: 2013).*

Lin, M.-B. (2012). Introduction to VLSI Systems: A Logic, Circuit, and System Perspective (1st ed.). CRC Press. (Year: 2012).*

* cited by examiner

RECEIVER WITH TRANSCODER AND ADAPTIVE FILTER

RELATED APPLICATION(S)

This application is a Continuation of U.S. patent Ser. No. 16/419,625, titled "OPTIMIZED MULTI-PAM FINITE IMPULSE RESPONSE (FIR) FILTER, filed May 22, 2019, which claims benefit of priority to Provisional U.S. Patent Application No. 62/676,001, titled "PAM4 FINITE IMPULSE RESPONSE (FIR) METHOD AND APPARATUS", filed May 24, 2018, the aforementioned priority applications being hereby incorporated by reference in their entirety.

TECHNICAL FIELD

The disclosure herein relates to digital signal processing systems, and more specifically to non-recursive adaptive filter architectures and associated filtering methods.

BACKGROUND

Pulse Amplitude Modulation (PAM) signaling schemes provide an efficient way to express multi-bit symbols during sampling operations. PAM4 symbols generally exhibit one of four possible threshold values (−3, −1, +1, +3), expressed as a 3-bit twos-complement number. Conventional adaptive filtering techniques to filter the 3-bit symbol values generally become more complex as the number of input symbol bits increase.

FIG. 1 illustrates a conventional 3-tap finite impulse response (FIR) filter that receives a sampled 3-bit threshold value from a PAM4 input symbol stream $x_k$. The filter includes a plurality of delay elements 102 and 104, for delaying previously sampled data from the symbol stream. A number of taps $C_0$-$C_2$ are respectively coupled to the input symbol stream and each of the delay output nodes. The taps receive respective weights or coefficients $W_{coeff}$ that represent gain factors applied to a sequence of data samples in a weighted manner. A summing circuit 106 receives the weighted samples from the taps, averages them, and outputs a filtered value $y_k$.

With ever-increasing data rates and circuit integration, employing parallel arrays of adaptive filters, each with "N" taps in parallel creates an increasingly complex circuit with a corresponding level of required computing overhead that not only impacts the circuit footprint, but also its power parameters. It would be desirable to address such issues without overly complex circuitry.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of receiver circuits, adaptive filters, and associated methods are disclosed. For one embodiment, a receiver circuit includes an input circuit configured to receive a data stream defined by a plurality of input symbols. Ones of the input symbols are encoded with M-bit values. A transcoder transcodes the input symbols in the data stream encoded with M-bit values to a stream of transcoded symbols. Ones of the transcoded symbols are encoded with N-bit values, where N<M. An adaptive filter is configured to remove noise from the stream of transcoded symbols to generate a stream of filtered transcoded symbols. A recoder is configured to recode the stream of filtered transcoded symbols to a stream of recoded symbols, where ones of the recoded symbols are encoded with M-bit values.

Figure 2:
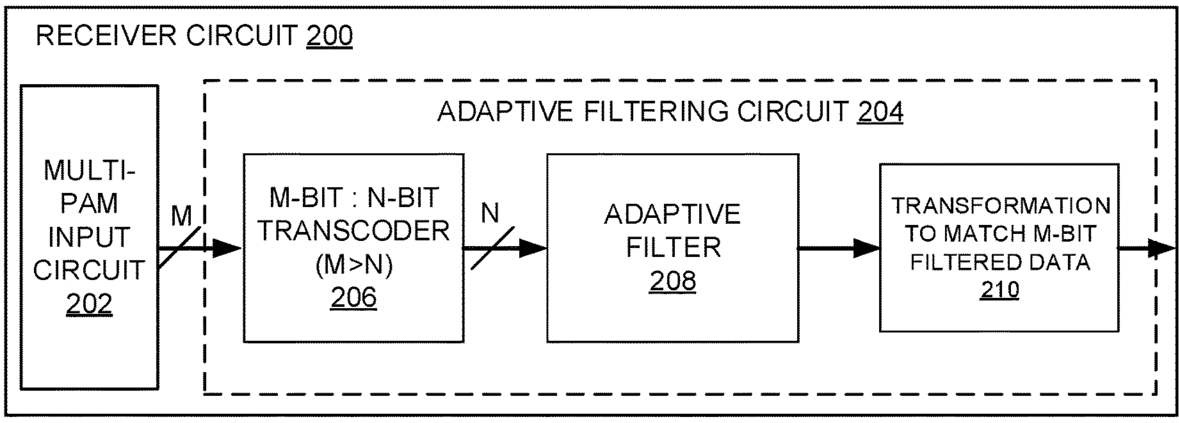
FIG. 2 illustrates one embodiment of a receiver circuit that employs an optimized filtering circuit.

FIG. 2 illustrates one embodiment of a receiver circuit 200 that includes a multi-PAM input circuit 202 and an adaptive filtering circuit 204. The multi-PAM input circuit 202 generally receives an input symbol stream, such as a PAM4 symbol stream, and samples the symbols to generate an M-bit stream of values. For a PAM4 receiver, each symbol generally exhibits a voltage level that falls within one of four voltage ranges. Each voltage range corresponds to a multi-bit sequence. When encoded in a two's-complement manner, each multi-bit value is a three-bit value from the set of values including (−3, −1, +1, +3). Once sampled and converted to digital form, the 3-bit values (where M=3) are fed to the adaptive filtering circuit 204.

Further referring to FIG. 2, one embodiment of the adaptive filtering circuit 204 includes a first transcoder 206 that recodes the M-bit value (such as a 3-bit value), into a reduced-bit value N (such as a 2-bit value). For one specific embodiment, the first transcoder recodes the stream of PAM4 input symbols into a modified stream consistent with the following relationship:

$$\tilde{x}_k = \frac{1}{2}\cdot(x_k - 1)$$

The operation generally removes the least-significant bit (LSB) from the original data and applies a 1-bit right shift to the remaining two bits.

With continued reference to FIG. 2, the resulting 2-bit data stream is then fed into a non-recursive adaptive filter 208, such as a finite impulse response (FIR) filter. The output data of the adaptive filter may be represented by the following relationship:

$$\tilde{y}_k = \sum_{j=0}^{N-1} C_j\cdot\tilde{x}_{k-j} = \frac{1}{2}\cdot\sum_{j=0}^{N-1} C_j\cdot x_{k-j} - \frac{1}{2}\cdot\sum_{j=0}^{N-1} C_j$$

Figure 1:
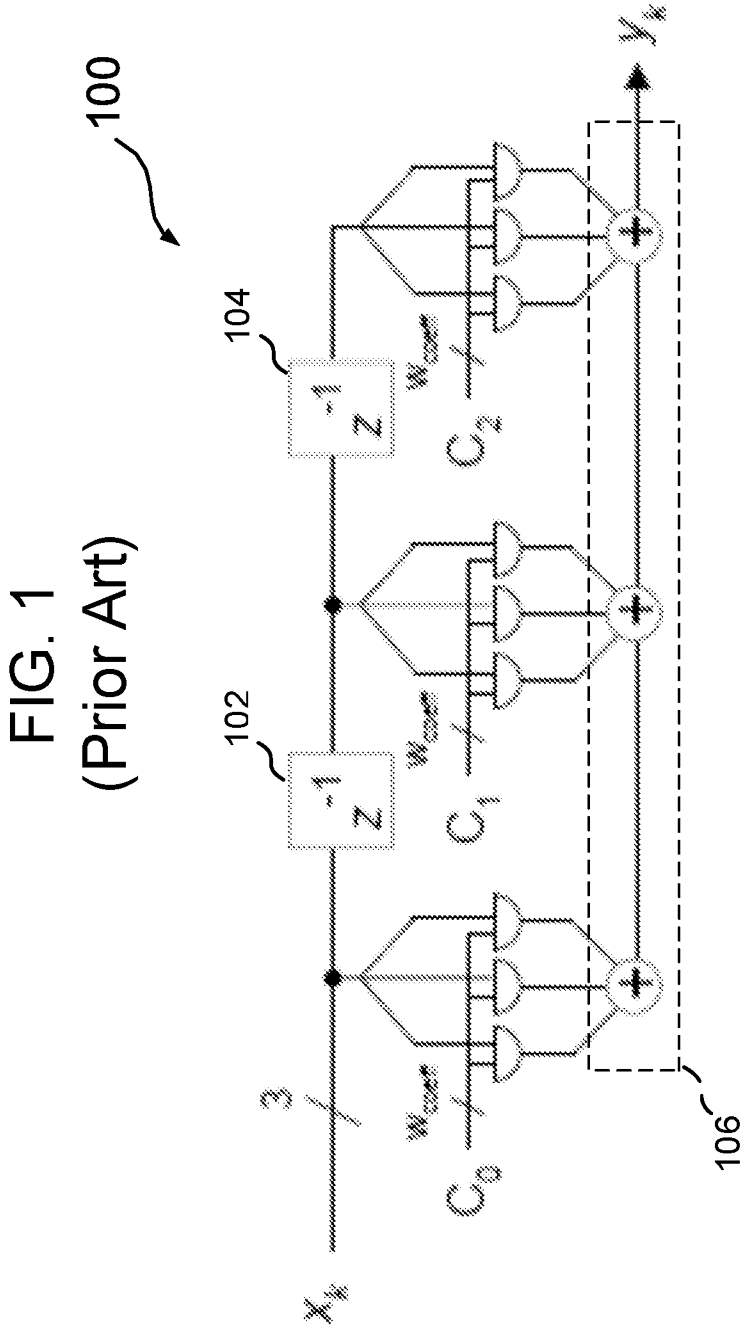
FIG. 1 illustrates a conventional 3-tap FIR filter utilized for a twos-complement 3-bit PAM4 input symbol.

The relationship above may be rewritten to the following relationship that defines the output of a conventional filter circuit, such as the filter circuit 100 of FIG. 1, to be equivalent to the summation of the output of a less complex adaptive filter, such as filter 208, along with a summation circuit to carry out a corrective summation (of all the coefficient values):

$$y_k = 2\cdot\sum_{j-0}^{N-1} C_j\cdot\tilde{x}_{k-j} + \sum_{j=0}^{N-1} C_j$$

Figure 3:
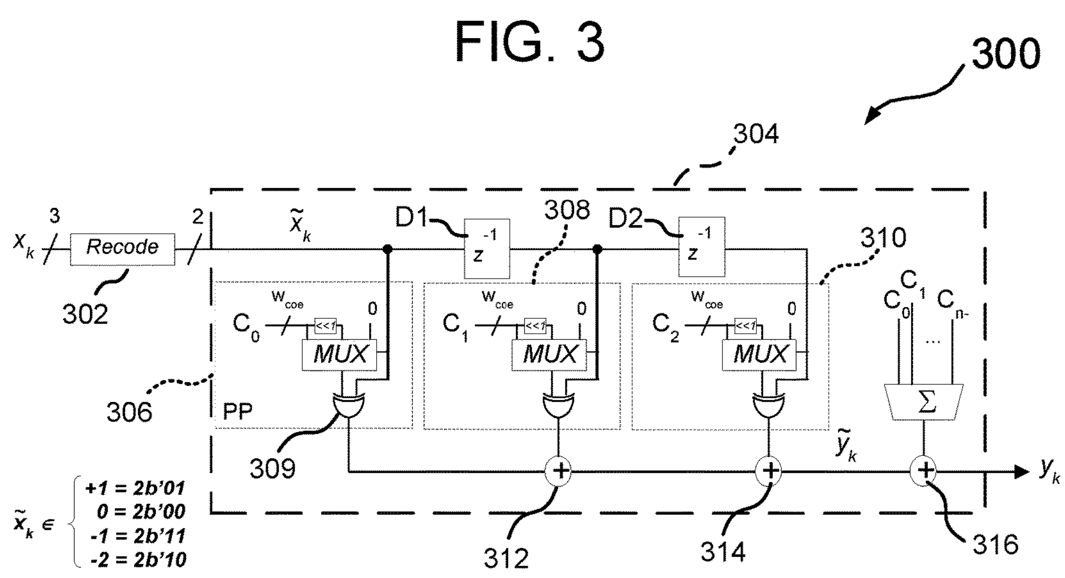
FIG. 3 illustrates further detail of one embodiment of an optimized filtering circuit consistent with the filtering circuit of FIG. 2.

Referring now to FIG. 3, further detail for one specific embodiment of an adaptive filtering circuit 300 is shown. A 3-bit input stream $x_k$ feeds a first transcoder or recoder circuit 302, that recodes the 3-bit two's-complement values to a 2-bit value stream of bits $x_k'$ consistent with the LSB removal and bit shifting discussed above. The 2-bit value stream of bits xx' is then fed to a finite impulse response (FIR) filter 304 that employs at least three tap circuits 306, 308 and 310. Each tap circuit is disposed at equally spaced delay intervals of a delay line having delay elements D1 and D2. For one specific embodiment, each tap weight circuit includes a multiplexer MUX to receive a tap weight value (such as $C_0$ for tap circuit 304, $C_1$ for circuit 306, etc.). The multiplexer output is then fed to an XOR circuit 309 that applies an XOR operation to the 2-bit data stream to generate a partial product output. Each of the tap circuit partial product outputs are summed, at 312 and 314. A final summation circuit 316 provides a corrective sum of the coefficients to the filtered data bit stream, thereby transforming the filtered data stream back to a data stream corresponding to a data stream that would be achieved via a conventional circuit such at the circuit 100 of FIG. 1.

The adaptive filtering circuit described above lends itself well to the relationship discussed above with regards to the high-level receiver circuit of FIG. 2. Since the set of recoded symbols is limited to {−2, −1, 0, +1}, the multiplication of such a symbol with a coefficient value can be done in a single step leading to a single partial product per coefficient. The sign inversion can be done by the XOR operation, the multiplication by 2, 1, or 0 can be implemented by a MUX selecting the single bit shifted coefficient, the original coefficient, and zero. Finally, the total number of summation operations with the modified difference equation (which is equivalent to the original one still) is 2·n (n for the modified filter operation plus n for the summation of coefficients).

While not shown in FIGS. 2 and 3, the adaptive filtering circuit 300 may often employ identical circuit "slices" that operate in parallel to process data faster. For example, the adaptive filter circuit 300 may be parallelized to a degree of "p", such that the clock rate for each adaptive filter is 1/p the clock rate of the incoming bit stream. With the parallelized circuitry, the relative complexity of the adaptive filter may impact the overall operability of the receiver circuit. Thus, by minimizing the complexity of the adaptive filter, achievable through the unique transcoding method described above, the overall receiver architecture may be optimized. For example, assuming the complexity of the AND operation for doing the partial multiplication in a conventional filter, such as the filter 100, to be $\frac{1}{6}^{th}$ of the summation operation and assuming the complexity of the modified partial product operation in the 2-bit filter 304 to be about half of a summation, the reduction of complexity for the proposed filter structure is >2× for a typical parallelization of 16:

$$\frac{16\cdot 3\cdot n\cdot 1\frac{1}{6}}{16\cdot n\cdot 1\frac{1}{2}+n}=2.24$$

Figure 4:
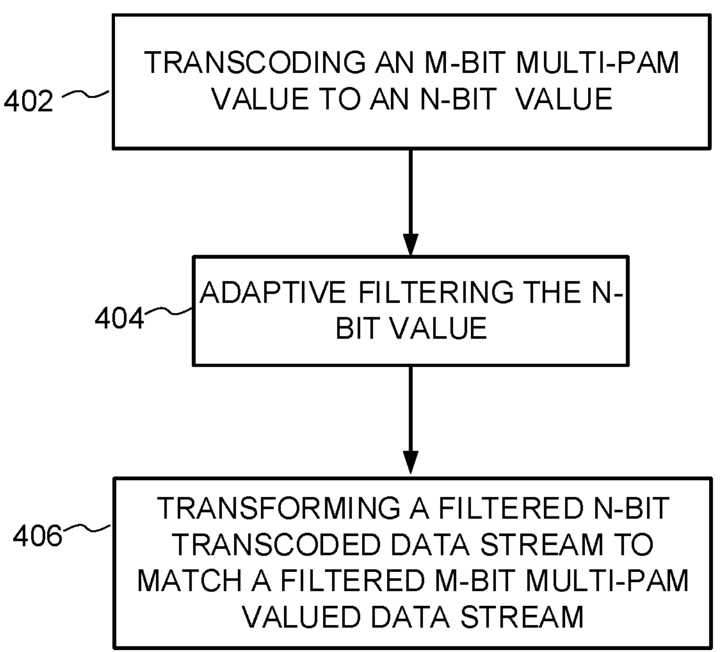
FIG. 4 illustrates a flowchart of a method of operation corresponding to the optimized filtering circuit of FIG. 2.

FIG. 4 illustrates a flow diagram illustrating one embodiment of a method of operation for a receiver circuit, generally designated 400, that is consistent with the systems and circuitry described herein. The method includes first transcoding an M-bit multi-PAM value to an N-bit threshold value, where N<M, at 402. The transcoded value is then adaptively filtered, at step 404. As explained above, for one embodiment, the adaptive filter is optimized such that a reduced number of partial-products are generated internally, enabling a reduced-complexity design. The filtered value is then recoded back to match the output of an M-bit data filtered value, at 406.

Those having skill in the art will appreciate that the embodiments described herein enable the use of a less-complex adaptive filtering circuit to provide filtering for advanced multi-level signaling schemes, such as PAM4. By enabling use of less-complex circuitry, circuit size, power, and computational overhead may be significantly reduced, thereby enhancing the overall circuit operating parameters.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A receiver circuit, comprising:

an input circuit configured to receive at an input of the receiver circuit a data stream defined by a plurality of input symbols, each of the input symbols being encoded with a respective M-bit value;

a transcoder circuit configured to transcode the input symbols in the data stream from each of the input symbols being encoded with M-bit values to a stream of transcoded symbols, each of the transcoded symbols being transcoded from a respective one of the input symbols and being encoded with a respective N-bit value in preparation for adaptive filtering, wherein $N<M$;

an adaptive filter downstream from the transcoder circuit and configured to perform the adaptive filtering including removing noise from the stream of transcoded symbols output from the transcoder circuit to generate a stream of filtered transcoded symbols, each of the filtered transcoded symbols having a respective N-bit value, and the adaptive filter comprising a plurality of electronic circuits, each of the plurality of electronic circuits configured to receive the stream of transcoded symbols, and a plurality of delay elements connected to inputs of the plurality of electronic circuits and configured to delay reception of the stream of transcoded symbols at ones of the plurality of electronic circuits; and a recoder circuit downstream from the adaptive filter and configured to recode the stream of filtered transcoded symbols output from the adaptive filter to a stream of recoded symbols, each of the recoded symbols being encoded with a respective M-bit value.

2. The receiver circuit according to claim 1, wherein:

the input circuit is implemented as a multi-pulse amplitude modulation (PAM) input circuit;

the plurality of input symbols are multi-PAM input symbols; and each multi-bit value of the plurality of input symbols is encoded in a two's complement manner to have a three-bit value from a set of values including (−3, −1, +1, +3).

3. The receiver circuit according to claim 2, wherein:

the adaptive filter is implemented as a finite impulse response (FIR) filter comprising an input;

the plurality of delay elements are connected in series and comprise a first delay element and a second delay element; and the plurality of electronic circuits are implemented as a plurality of tap circuits comprising a first tap circuit connected to the input of the FIR filter and to an input of the first delay element, a second tap circuit connected to an output of the first delay element, and a third tap circuit connected to an output of the second delay element.

4. The receiver circuit according to claim 3, wherein each of the plurality of tap circuits comprises a respective multiplexer and a respective exclusive OR (XOR) gate.

5. The receiver circuit according to claim 4, wherein:

each of the plurality of tap circuits generates a single partial product; and the adaptive filter is configured to generate a sum of the single partial products from the plurality of tap circuits.

6. The receiver circuit according to claim 1, wherein:

the input circuit is implemented as a multi-pulse amplitude modulation (PAM) input circuit; and the plurality of input symbols are PAM4 input symbols.

7. The receiver circuit according to claim 1, wherein ones of the input symbols are encoded with M-bit two's-complement values.

8. The receiver circuit of claim 1, wherein the plurality of electronic circuits are configured to remove noise from the stream of transcoded symbols to generate the stream of filtered transcoded symbols by generating partial product outputs based on the stream of the transcoded symbols to generate the stream of filtered transcoded symbols.

9. The receiver circuit of claim 1, wherein the first transcoder circuit is configured to remove a least significant bit from each of the input symbols and 1-bit shift remaining bits of each of the input symbols.

10. The receiver circuit of claim 1, wherein:

the plurality of electronic circuits are configured to receive respectively a plurality of coefficients; and each of the plurality of electronic circuits comprises a multiplexer configured based on the transcoded symbols to select from a zero input and a respective one of the plurality of coefficients.

11. The receiver circuit of claim 10, wherein each of the plurality of electronic circuits comprises an exclusive OR (XOR) gate configured to determine an XOR between an output of a corresponding one of the multiplexers and the transcoded symbols.

12. The receiver circuit of claim 11, wherein the adaptive filter further comprises a plurality of summers configured to sum outputs of the plurality of electronic circuits to provide the filtered transcoded symbols.

13. The receiver circuit of claim 12, wherein:

the adaptive filter is implemented as a finite impulse response (FIR) filter comprising an input;

the plurality of delay elements are connected in series and comprise a first delay element and a second delay element; and the plurality of electronic circuits are implemented as a plurality of tap circuits comprising a first tap circuit connected to the input of the FIR filter and to an input of the first delay element, a second tap circuit connected to an output of the first delay element, and a third tap circuit connected to an output of the second delay element.

14. The receiver circuit of claim 13, further comprising at least one additional summer configured to sum the plurality of coefficients with the sum of the outputs of the plurality of electronic circuits to provide the filtered transcoded symbols.

15. The receiver circuit of claim 1, wherein a quantity of the transcoded symbols in the stream of transcoded symbols equals a quantity of the input symbols in the data stream.

16. The receiver circuit of claim 1, wherein a quantity of the filtered transcoded symbols in the stream of filtered transcoded symbols equals a quantity of the recoded symbols in the stream of recoded symbols.

17. The receiver circuit of claim 1, wherein:

the input circuit is a multi-PAM input circuit configured to receive a multi-PAM input symbol, the multi-PAM input symbol exhibiting a signal level that falls within one of multiple signal ranges during a sampling period, one of the plurality of input symbols is the multi-PAM input symbol, and the signal ranges corresponding to a set of M-bit two's complement values; and the multi-PAM input circuit configured to identify the signal level of the input symbol and the corresponding one of the M-bit two's complement values in the set of M-bit two's complement code-values corresponding to the identified signal level.

18. The receiver circuit of claim 17, wherein:

the transcoder circuit is configured to transcode the one of the M-bit two's complement values to an N bit code representing a value from a set of a respective N-bit two's complement value;

the adaptive filter is configured to receive the respective N-bit two's complement value and to generate a filtered data value; and the recoder circuit is configured to transform the filtered data value to a second data value that corresponds to a filtered M-bit two's complement value.

19. The receiver circuit of claim 1, wherein the transcoder circuit is configured, during the transcoding of the input symbols, to remove a least significant bit from each of the input symbols and right shift remaining bits of each of the input symbols.

20. An adaptive filtering circuit including:

a transcoder circuit configured to transcode input symbols of a data stream from each of the input symbols being encoded with M-bit values to a stream of transcoded symbols, each of the transcoded symbols being transcoded from a respective one of the input symbols and encoded with a respective N-bit value in preparation for adaptive filtering, wherein N<M;

an adaptive filter downstream from the transcoder circuit and configured to perform the adaptive filtering including removing noise from the stream of transcoded symbols output from the transcoder circuit to generate a stream of filtered transcoded symbols, each of the filtered transcoded symbols having a respective N-bit value, and the adaptive filter comprising a plurality of electronic circuits, each of the plurality of electronic circuits configured to receive the stream of transcoded symbols, and a plurality of delay elements connected to inputs of the plurality of electronic circuits and configured to delay reception of the stream of transcoded symbols at ones of the plurality of electronic circuits; and a recoder circuit downstream from the adaptive filter circuit and configured to recode the stream of filtered transcoded symbols output from the adaptive filter to a stream of recoded symbols, each of the recoded symbols being encoded with a respective M-bit value.

21. The adaptive filtering circuit according to claim 20, embodied as a finite impulse response (FIR) filter.

22. The adaptive filtering circuit according to claim 21, further comprising at least three taps.

23. The adaptive filtering circuit according to claim 22, wherein:

each of the at least three taps generates a single partial product; and the adaptive filter is configured to generate a sum of the single partial products from each of the at least three taps.

24. The adaptive filtering circuit of claim 20, wherein the transcoder circuit further comprises circuitry to remove a least-significant-bit (LSB) value from each of the M-bit values of the input symbols to generate a set of remaining bit values, and to apply a 1-bit right shift operation to the set of remaining bit values to generate the N-bit values of the transcoded symbols.

25. A method of operation for a receiver circuit, the method comprising:

receiving at the receiver circuit a data stream defined by a plurality of input symbols, each of the input symbols being encoded with a respective M-bit value;

transcoding the input symbols in the data stream from each of the input symbols being encoded with a respective M-bit value to a stream of transcoded symbols, each of the transcoded symbols being transcoded from a respective one of the input symbols and being encoded with a respective N-bit value in preparation for adaptive filtering, wherein N<M;

performing the adaptively filtering, via a plurality of electronic circuits, of the transcoded symbols to generate a stream of filtered transcoded symbols, each of the filtered transcoded symbols having a respective N-bit value and the adaptive filtering comprising via a plurality of delay elements connected to inputs of the plurality of electronic circuits, delaying reception of the stream of transcoded symbols at ones of the plurality of electronic circuits, and subsequent to the delaying, receiving the stream of transcoded symbols at each of the plurality of electronic circuits; and recoding the stream of filtered transcoded symbols resulting from the adaptive filtering to a stream of recoded symbols, each of the recoded symbols being encoded with a respective M-bit value.

26. The method according to claim 25, wherein the receiving of the plurality of input symbols comprises receiving a plurality of multi-PAM input symbols.

27. The method according to claim 26, wherein the receiving of the plurality of multi-PAM input symbols comprises receiving a plurality of PAM4 input symbols.

28. The method according to claim 25, wherein the transcoding further comprises:

removing a least-significant-bit (LSB) value from each of the M-bit values of the input symbols to generate a set of remaining bit values; and performing a 1-bit right shift operation to the set of remaining bit values to generate the N-bit values of the transcoded symbols.

* * * * *